(12) United States Patent
Kim

(10) Patent No.: US 8,022,500 B2
(45) Date of Patent: Sep. 20, 2011

(54) SEMICONDUCTOR DEVICE HAVING A HIGH ASPECT RATIO ISOLATION TRENCH

(75) Inventor: Tai Ho Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 64 days.

(21) Appl. No.: 12/494,907

(22) Filed: Jun. 30, 2009

(65) Prior Publication Data

US 2010/0123211 A1 May 20, 2010

(30) Foreign Application Priority Data

Nov. 14, 2008 (KR) .................... 10-2008-0113404

(51) Int. Cl.
*H01L 21/762* (2006.01)

(52) U.S. Cl. ......... 257/510; 257/E21.548; 257/E27.084; 438/427

(58) Field of Classification Search .................. 257/510, 257/E21.548, E27.084; 438/427, 700
See application file for complete search history.

(56) References Cited

U.S. PATENT DOCUMENTS

| | | | |
|---|---|---|---|
| 6,756,654 B2 * | 6/2004 | Heo et al. ....................... | 257/510 |
| 7,033,907 B2 * | 4/2006 | Kim .............................. | 438/425 |
| 7,691,722 B2 * | 4/2010 | Zhou ............................ | 438/427 |
| 2005/0179112 A1 * | 8/2005 | Belyansky et al. ........... | 257/510 |
| 2006/0024912 A1 * | 2/2006 | Lee ............................... | 438/424 |
| 2006/0214258 A1 * | 9/2006 | Kiyotoshi ..................... | 257/510 |
| 2006/0223279 A1 * | 10/2006 | Patraw et al. ................. | 438/427 |
| 2006/0246684 A1 | 11/2006 | Hoshi et al. | |
| 2008/0003775 A1 * | 1/2008 | Yamada et al. ............... | 438/427 |
| 2008/0146000 A1 * | 6/2008 | Lee ............................... | 438/424 |
| 2008/0166854 A1 * | 7/2008 | Shin et al. ..................... | 438/427 |
| 2008/0182381 A1 * | 7/2008 | Kiyotoshi ..................... | 438/427 |
| 2009/0020847 A1 * | 1/2009 | Byun et al. .................... | 257/510 |
| 2009/0256233 A1 * | 10/2009 | Eun ............................... | 257/510 |

FOREIGN PATENT DOCUMENTS

| | | | |
|---|---|---|---|
| KR | 1020050052625 A | | 6/2005 |
| KR | 1020060076587 A | | 7/2006 |
| KR | 1020070109483 A | | 11/2007 |

* cited by examiner

*Primary Examiner* — Toniae Thomas
(74) *Attorney, Agent, or Firm* — Ladas & Parry LLP

(57) ABSTRACT

A semiconductor device having high aspect ratio isolation trenches and a method for manufacturing the same is presented. The semiconductor device includes a semiconductor substrate, a first insulation layer, and a second insulation layer. The semiconductor substrate has a second trench that is wider than a first trench. The first insulation layer is partially formed within the wider second trench in which the first insulation layer when formed clogs the opening of the narrower first trench. A cleaning of the first insulation layer unclogs the opening of the narrower first trench in which a second insulation layer can then be formed within both the first and second trenches.

7 Claims, 6 Drawing Sheets

SEMICONDUCTOR DEVICE HAVING A HIGH ASPECT RATIO ISOLATION TRENCH

CROSS-REFERENCE TO RELATED APPLICATIONS

The present application claims priority to Korean patent application number 10-2008-0113404 filed on Nov. 14, 2008, which is incorporated herein by reference in its entirety.

BACKGROUND OF THE INVENTION

The present invention relates to a semiconductor device and a method for manufacturing the same, and more particularly, to a semiconductor device which has improved performance characteristics and a method for manufacturing the same.

It is well known that the continued demands for higher speed operations and for higher integration of a semiconductor device have continued to rapidly drive the development of various semiconductor technologies. As a result these demands requirements for more refined patterns, i.e., higher precision and higher accuracy in the underlying circuit patterns have also increased. These requirements are applied not only to patterns that are formed in device regions but also to an isolation structure that occupies a relatively large area.

The isolation structure is usually formed using an STI (shallow trench isolation) process. This is because the isolation structure formed using the STI process enjoys the benefits of having a small width and excellent isolation characteristics. For this reason, in most semiconductor devices, isolation structures are formed using the STI process.

As the integration degree of a semiconductor device is increased, the width of a trench necessarily decreases, however the need remains to assure that the relative depth of the these trench are increased. In this regard, a problem arises when filling the trench due to this increased aspect ratio demand in the trenches.

Under these situations, an HARP (high aspect ratio process) or a PDL (pulsed deposition layer) is adopted to address this problem caused when filling a trench. However, since the HARP or PDL employs a conformal deposition method, undesirable limitations remain in properly filling a trench. Hence, an isolation structure is currently formed using a single layer comprising an HDP (high density plasma) layer or an SOD (spin-on dielectric) layer or using the stack of a lower SOD layer having excellent gap-fill capability and an upper HDP layer having high density.

Nevertheless, although not shown in a drawing, in the case of the single layer comprising the HDP layer, as the width of a trench gradually decreases with the high integration of a semiconductor device, adequate gap-filling becomes impossible. Accordingly, it is anticipated that an isolation structure comprising the single layer of the HDP layer will be difficult to provide when applied to a next-generation of highly integrated semiconductor devices.

Also, in the case of the single layer comprising the SOD layer, contraction can occur due to a moat phenomenon and as a result the resultant SOD layer can be deformed. That is, when subsequently forming recess gates, the space between the gates is reduced and the margin of a recessing process decreases so that the process for forming landing plug contacts can fail. Accordingly, manufacturing non-deformed isolation structures that comprise single SOD layers is difficult to achieve.

Further, in the case of manufacturing the stack isolation structures that comprise the SOD layer and the HDP layer, cracks and punch-through are likely to occur due to the deformed resultant SOD layer and due to the differences in stress between the SOD layer and the HDP layer. Accordingly, making a non-deformed isolation structure comprising the stack of the SOD layer and the HDP layer is also difficult to achieve.

Thus, novel measures for solving the problems caused when filling a trench having a substantial aspect ratio are keenly demanded in the art.

BRIEF SUMMARY OF THE INVENTION

Embodiments of the present invention are directed to a semiconductor device which can easily fill a trench having a relatively large aspect ratio and a method for manufacturing the same.

Also, a number of embodiments of the present invention are directed to semiconductor devices which can prevent or at least protect against an isolation structure from allowing unwanted electrical contracts to occur. Thereby these embodiments avoid or at least minimize the occurrence of electrical failure associated with landing plug contacts.

Further, embodiments of the present invention are directed to a semiconductor device and a method for manufacturing the same which can prevent or at least minimize the occurrence of cracks and punch-through brought about by stress differences between an SOD layer and an HDP layer.

In one embodiment of the present invention, a semiconductor device comprises a semiconductor substrate having a first trench and a second trench which has a larger width than the first trench; a first insulation layer formed on a surface of the second trench; and a second insulation layer formed to fill the second trench which is partially filled with the first insulation layer and the first trench.

The first trench is defined in a space between storage node contact zones adjoining each other, and the second trench is defined in a space between bit line contact zones facing each other.

The semiconductor device further comprises a sidewall oxide, a linear nitride layer and a linear oxide layer interposed between the first trench and the second insulation layer and between the second trench and the first insulation layer.

The first insulation layer comprises a dense insulation layer.

The dense insulation layer comprises an HDP (high density plasma) layer.

The second insulation layer comprises a flowable insulation layer.

The flowable insulation layer comprises an SOD (spin-on dielectric) layer.

The semiconductor device further comprises gates formed on the first insulation layer on both sides of the second insulation layer buried in the second trench such that the gates are partially buried in the first insulation layer.

In another embodiment of the present invention, a method for manufacturing a semiconductor device comprises the steps of defining a first trench and a second trench which has a larger width than the first trench, in a semiconductor substrate; forming a first insulation layer on the semiconductor substrate including the first and second trenches such that an entrance of the first trench is clogged by the first insulation layer and the first insulation layer is deposited on a surface of the second trench; cleaning the first insulation layer such that the entrance of the first trench is open; and forming a second insulation layer in such a way as to fill the second trench in which the first insulation layer is partially filled and the first trench.

The first trench is defined in a space between storage node contact zones adjoining each other, and the second trench is defined in a space between bit line contact zones facing each other.

After the step of defining the first and second trenches, the method further comprises the step of forming sequentially a sidewall oxide, a linear nitride layer and a linear oxide layer on surfaces of the first and second trenches.

The first insulation layer comprises a dense insulation layer.

The dense insulation layer comprises an HDP (high density plasma) layer.

The step of forming the first insulation layer is implemented in an SDR (sputter deposition ratio) condition of about 0.01~0.05, in a power condition of about 3,000~7,000 W of source power and about 1,000~1,500 W of bias power, and in a concentration condition of about 100~300 sccm of $SiH_4$.

The second insulation layer comprises a flowable insulation layer.

The flowable insulation layer comprises an SOD (spin-on dielectric) layer.

After the step of forming the second insulation layer, the method further comprises the step of annealing the second insulation at a temperature of about 600~900° C. with a pressure of about 600~760 Torr in an atmosphere having a ratio between $H_2O:O_2$ of 1:2~1:5.

After the step of forming the second insulation layer, the method further comprises the step of forming gates on the first insulation layer on both sides of the second insulation layer buried in the second trench so that the gates are partially buried in the first insulation layer.

DESCRIPTION OF SPECIFIC EMBODIMENTS

Hereafter, specific embodiments of the present invention will be described in detail with reference to the accompanying drawings. It is understood herein that the drawings are not necessarily to scale and in some instances proportions may have been exaggerated in order to more clearly depict certain features of the invention.

Figure 1:
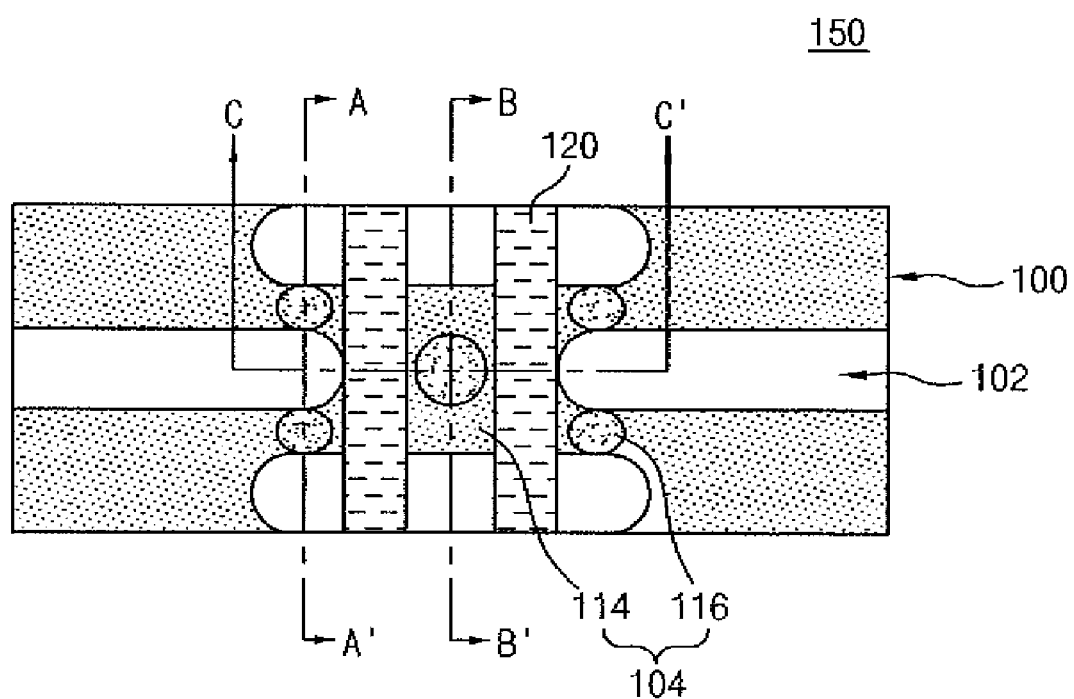
FIG. 1 is a plan view illustrating a semiconductor device in accordance with a first embodiment of the present invention.
Figure 2A:
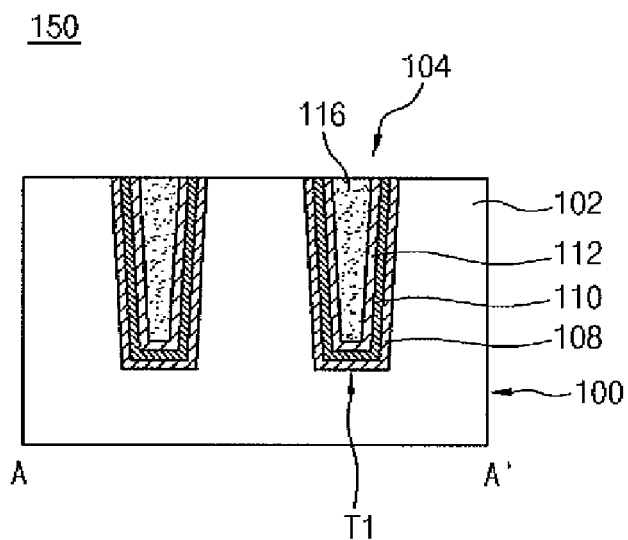
FIGS. 2A through 2C are sectional views respectively taken along the lines A-A', B-B' and C-C' of FIG. 1, illustrating the semiconductor device in accordance with the first embodiment of the present invention.
Figure 2B:
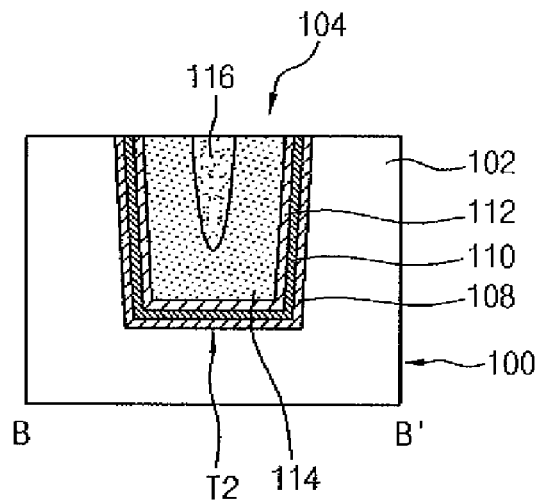
Figure 2C:
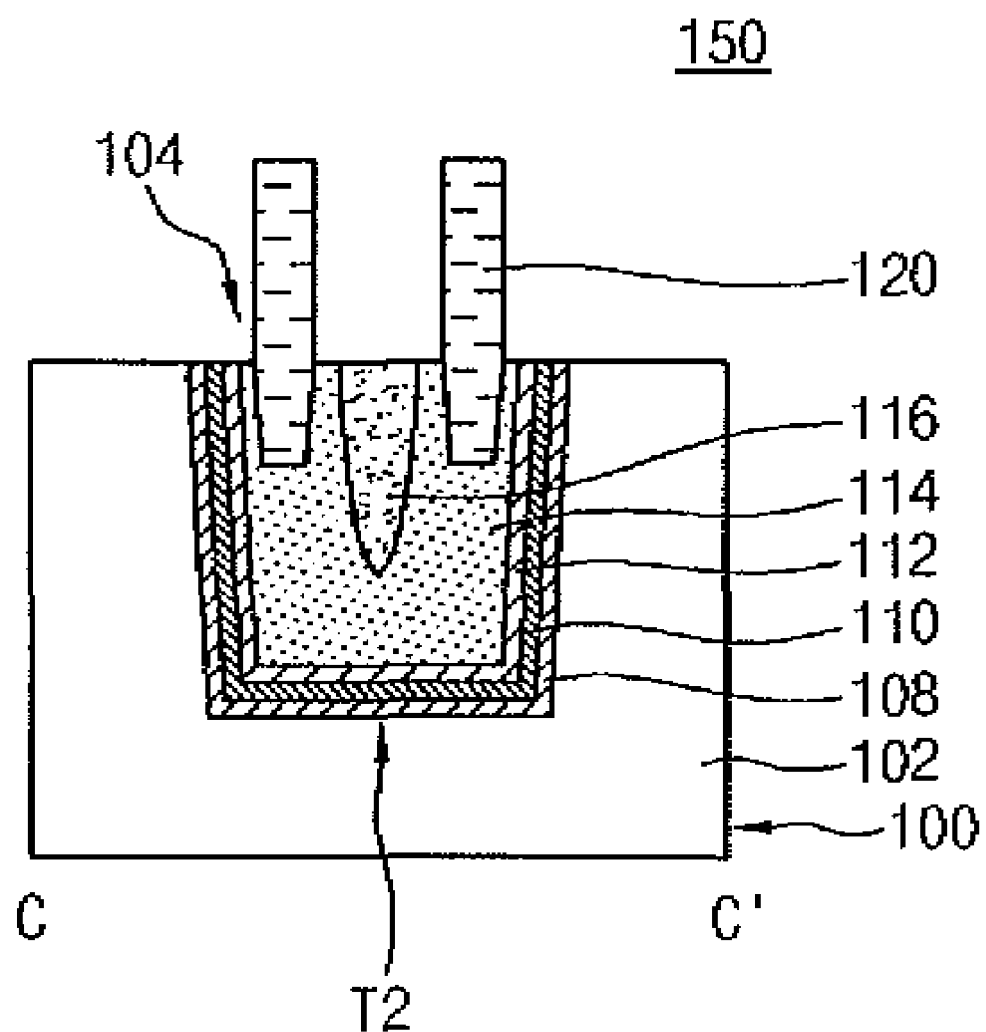

FIG. 1 is a plan view illustrating a semiconductor device in accordance with a first embodiment of the present invention, and FIGS. 2A through 2C are sectional views respectively taken along the lines A-A', B-B' and C-C' of FIG. 1, illustrating the semiconductor device in accordance with the first embodiment of the present invention.

Referring to these drawings, a semiconductor device 150 in accordance with a first embodiment of the present invention includes a semiconductor substrate 100 and an isolation structure 104 which is formed in the semiconductor substrate 100 that delimits the active regions 102.

The isolation structure 104 has a first trench T1 and a second trench T2 which has a larger width than the first trench T1. The first trench T1 is defined in the space between end portions of adjoining active regions 102, that is, the space between adjoining storage node contact zones. The second trench T2 is defined in the space between intermediate portions of active regions 102 facing each other with ends portions of two other active regions 102 interposed between them, that is, the space between bit line contact zones of the active regions 102 facing each other with storage node contact zones of the two other active regions 102 interposed between them. Accordingly, the second trench T2 is preferred to have a larger width than the first trench T1.

The isolation structure 104 includes a first insulation layer 114 and a second insulation layer 116 which are formed in the first and second trenches T1 and T2. The first insulation layer 114 is formed on the surface of the second trench T2. The first insulation layer 114 comprises a dense insulation layer. The dense insulation layer comprises, for example, an HDP (high density plasma) layer. The second insulation layer 116 is formed to fill the second trench T2 which is partially filled with the first insulation layer 114 and the first trench T1. The second insulation layer 116 preferably comprises a flowable insulation layer such as, for example, an SOD (spin-on dielectric) layer.

In addition, the semiconductor device 150 in accordance with the first embodiment of the present invention further includes a sidewall oxide 108, a linear nitride layer 110 and a linear oxide layer 112 which are interposed between the first trench T1 and the second insulation layer 116 and between the second trench T2 and the first insulation layer 114.

The semiconductor device 150 in accordance with the first embodiment of the present invention further includes recess type gates 120 which are formed on the first insulation layer 114 on both sides of the second insulation layer 116 buried in the second trench T2 such that the recess type gates 120 are partially buried into the first insulation layer 114. Preferably, the recess type gates 120 are formed in a line type configuration on the active regions 102 and the isolation structure 104.

FIGS. 3A through 3F are sectional views taken in correspondence to the lines A-A' and B-B' of FIG. 1, explaining a method for manufacturing a semiconductor device in accordance with a second embodiment of the present invention.

Figure 3A:
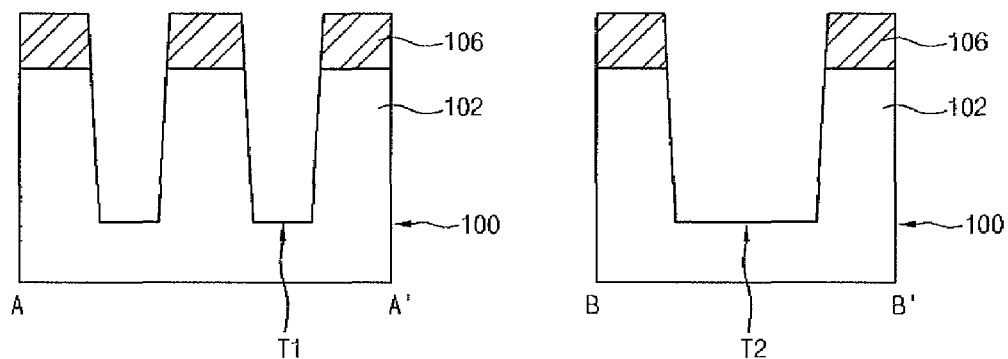
FIGS. 3A through 3F are sectional views taken in correspondence to the lines A-A' and B-B' of FIG. 1, explaining a method for manufacturing a semiconductor device in accordance with a second embodiment of the present invention.

Referring to FIG. 3A, a hard mask 106 is formed on a semiconductor substrate 100 which has active regions 102 and an isolation region, in such a way as to expose the isolation region. The exposed isolation region of the semiconductor substrate 100 is etched using the hard mask 106 as an etch mask. Through this, a first trench T1 and a second trench T2 are defined in which the second trench T2 has a larger width than the first trench.

Here, the first trench T1 is preferably defined in the space between end portions of adjoining active regions 102, that is, the space between adjoining storage node contact zones of the active regions 102. The second trench T2 is preferably defined in the space between intermediate portions of active regions 102 facing each other with ends portions of two other active regions 102 interposed between them, that is, the space between bit line contact zones of the active regions 102 facing each other with storage node contact zones of the two other active regions 102 interposed between them. Accordingly, the first trench T1 is preferably defined to have a smaller width than the second trench T2.

Figure 3B:
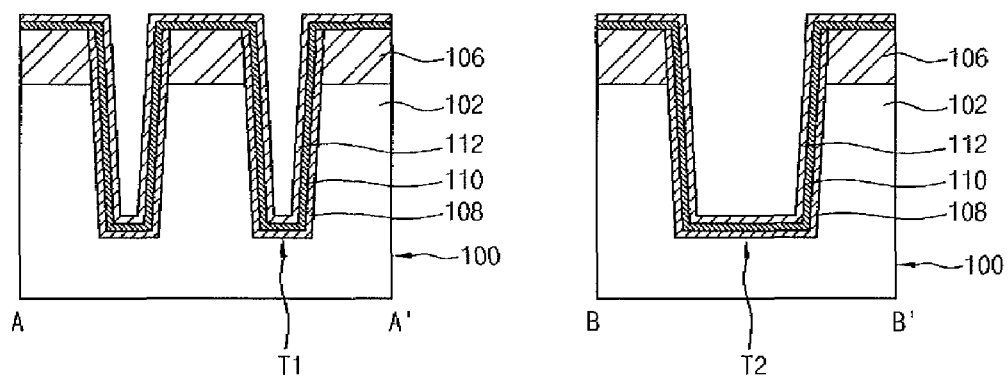

Referring to FIG. 3B, a sidewall oxide 108 is formed on the surfaces of the first trench T1 and the second trench T2 using a thermal oxidation process. Then, a linear nitride layer 110 and a linear oxide layer 112 are sequentially formed on the hard mask 106 and on the sidewall oxide 108.

Figure 3C:
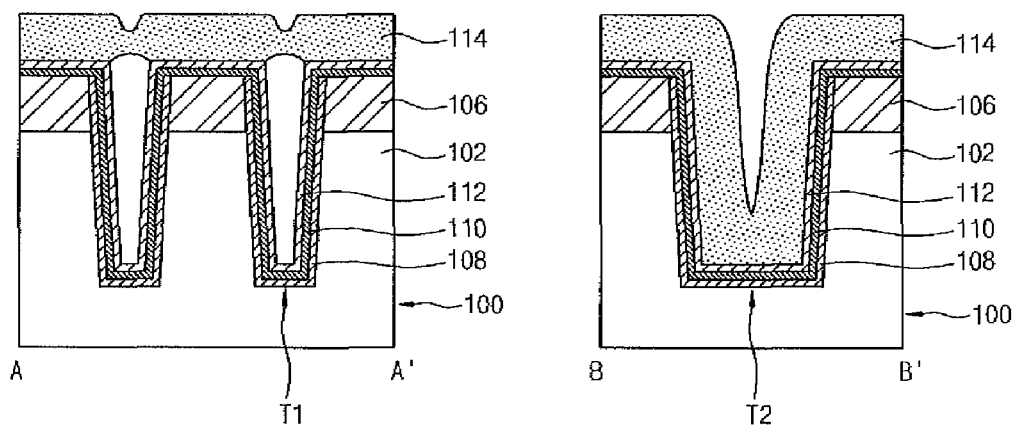

Referring to FIG. 3C, a first insulation layer 114 is formed over the semiconductor substrate 100 that has the first and second trenches T1 and T2 in which the sidewall oxide 108, the linear nitride layer 110 and the linear oxide layer 112 are sequentially formed. By intentionally lowering the gap-fill capability of the first insulation layer 114 so that the entrance of the first trench T1 having the smaller width is clogged by the first insulation layer 114 and the first insulation layer 114 is deposited on the surface of the linear oxide layer 112 in the second trench T2 having the larger width. The first insulation layer 114 which clogs the entrance of the first trench T1 is prepared using an SDR (sputter deposition ratio) condition of 0.01~0.05, using a power condition of about 3,000~7,000 W of source power and about 1,000~1,500 W of bias power, and using a flow rate condition of about 100~300 sccm of $SiH_4$. Also, the first insulation layer 114 preferably comprises a dense insulation layer such as for example an HDP (high density plasma) layer.

Here, it is understood that the SDR indicates a ratio between an etch rate by a sputter phenomenon occurring in an HDP process and a deposition rate by a redeposition phenomenon. SDR can be adjusted by changing a deposition pressure or by changing a flow rate of $SiH_4$ as a deposition gas or flow rates of other gases excluding $SiH_4$.

Figure 3D:
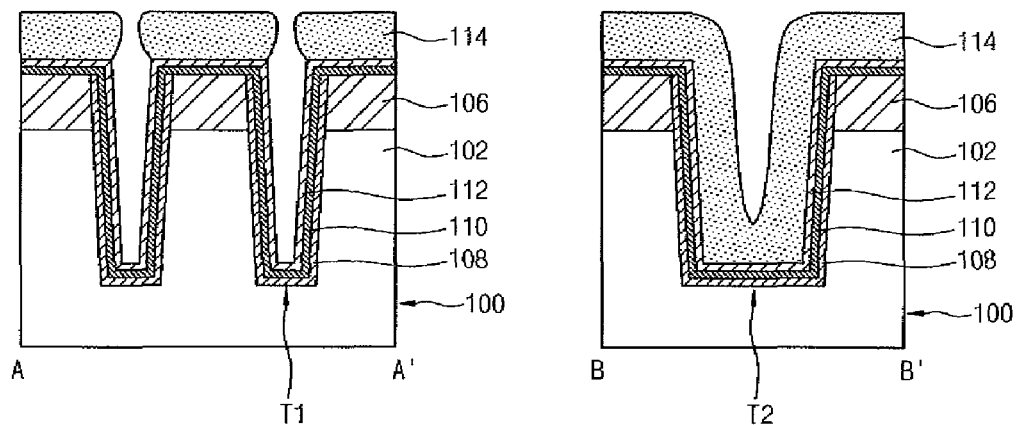

Referring to FIG. 3D, the first insulation layer 114 is sufficiently cleaned so that the entrance of the first trench T1 is re-opened.

Figure 3E:
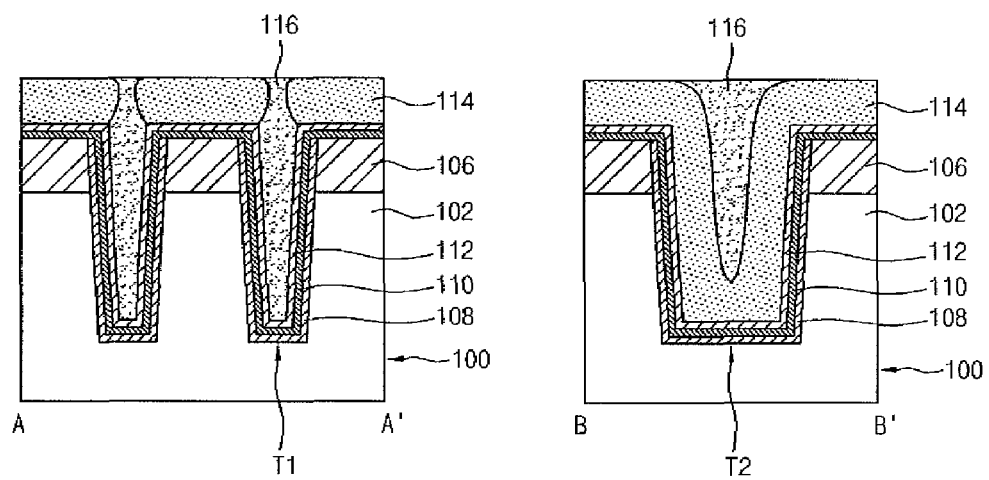

Referring to FIG. 3E, a second insulation layer 116 is formed over the resultant semiconductor substrate 100. This second insulation layer 116 substantially fills in the first trench T1, of which entrance has been opened by the cleaning. This second insulation layer 116 also fills in the second trench T2 in which the first insulation layer 114 is partially filled. The second insulation layer 116 preferably comprises a flowable insulation layer having excellent flowability such as for example an SOD (spin-on dielectric) layer.

As a result of forming the second insulation layer 116, only the second insulation layer 116 is formed in the first trench T1 having the small width. Whereas the first insulation layer 114 and the second insulation layer 116 are formed within the second trench T2. The second insulation layer 116 formed within the second trench T2 is surrounded by the first insulation layer 114. Because the first insulation layer 114 partially fills in the second trench T2 so that it surrounds the second insulation layer 116, a margin can be secured when recessing an isolation structure 104 in a subsequent process for forming recess gates.

In order to bake the second insulation layer 116, annealing is preferably at a temperature of about 600~900° C. with a pressure of about 600~760 Torr in an atmosphere having a ratio between $H_2O:O_2$ of about 1:2~1:5.

Figure 3F:
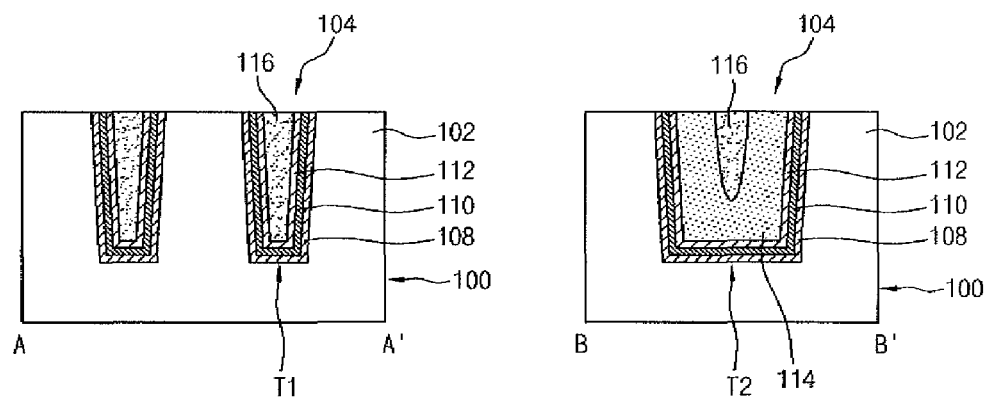

Referring to FIG. 3F, portions of the baked second insulation layer 116, the first insulation layer 114, the linear oxide layer 112 and the linear nitride layer 110 are removed using a CMP (chemical mechanical polishing) process so that the hard mask 106 is exposed. In succession, by removing the hard mask 106, the isolation structure 104 is completely formed in the semiconductor substrate 100 so that it can be used to delimit the active regions 102.

Next, after etching the gate forming zones of the active regions 102 to form recess gates, recess type gates 120 are preferably formed in a line type on the etched active region 102 and the isolation structure 104 (see FIG. 2C). When etching the active regions 102 to form the recess type gates 120, portions of the first insulation layer 114 are etched at a predetermined depth on both sides of the second insulation layer 116 buried in the second trench T2. As a result the gates 120, placed on the isolation structure 104, are partially buried in the etched portions of the first insulation layer 114.

In connection with the fact that the second insulation layer 116 is surrounded by the first insulation layer 114, the gates 120 are not formed in the second insulation layer 116 comprising a flowable insulation layer but rather are formed in the first insulation layer 114 comprising a dense insulation layer. Therefore, in the present invention, when conducting an etching process for forming the recess gates 120, the loss of the second insulation layer 116 can be protected against or prevented. Accordingly, a high resolution process margin can be secured when forming the recess gates 120.

Also, in the present invention, since the isolation structure 104 is formed such that the second insulation layer 116 comprising a flowable insulation layer is surrounded by the first insulation layer 114 comprising a dense insulation layer, the problem caused in the conventional isolation structure comprising the single layer of an SOD layer can be solved. As a consequence, since a space can be secured between adjoining gates, it is possible to effectively prevent the failure from occurring in a landing plug contact forming process.

Thereafter, while not shown in a drawing, by sequentially conducting a series of well-known subsequent processes, the manufacture of a semiconductor device according to the embodiment of the present invention is completed.

While it was illustrated and explained in the above embodiment that the first insulation layer is formed in such a way as to surround the second insulation layer so that the loss of the second insulation layer can be prevented when recessing the active regions in order to form the recess gates, the present invention can be applied even when forming fin gates so as to increase the width of a channel. In this case, due to the fact that the first insulation layer is formed to surround the second insulation layer, when etching the isolation structure so as to form the fin gates, the margin of a process for recessing the isolation structure can be increased.

As is apparent from the above description, in the present invention, when forming an isolation structure, the gap-fill capability of an HDP layer is intentionally lowered to ensure that only an SOD layer is filled in a trench having a small width. As a consequence, the same gap-fill margin as in the conventional isolation structure comprising the single layer of an SOD layer can be obtained.

Also, in the present invention, due to the fact the SOD layer is formed in the isolation structure as a thin layer, it is possible to prevent the isolation structure from contracting due to a moat phenomenon and the deforming characteristic of the SOD layer, and at the same time, since the margin of a process for forming recess gates can be secured, it is possible to effectively prevent the occurrence of fail in a process for forming landing plug contacts.

Further, in the present invention, because the isolation structure is formed to comprise the stack of the SOD layer and the HDP layer surrounding the SOD layer, it is possible to effectively prevent cracks and punch-through from occurring. This is thought to be due to avoiding the deforming characteristic of the SOD layer and a difference in stress between the SOD layer and the HDP layer.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
   a semiconductor substrate having a first trench and a second trench, wherein the second trench is wider than the first trench;
   a first insulation layer over the semiconductor substrate, the first insulation layer partially filling in the second trench and the first insulation layer substantially not filling in the first trench; and
   a second insulation layer over the semiconductor substrate and over the first insulation layer, the second insulation layer substantially filling in the second trench which is partially filled with the first insulation layer and the second insulation layer substantially filling in the first trench, wherein the first trench is positioned between storage node contact zones adjoining each other, and the second trench is positioned between bit line contact zones facing each other.

2. The semiconductor device according to claim 1, further comprising:
   a sidewall oxide, a linear nitride layer and a linear oxide layer interposed between the first trench and the second insulation layer; and
   the sidewall oxide, the linear nitride layer and the linear oxide layer interposed between the second trench and the first insulation layer.

3. The semiconductor device according to claim 1, wherein the first insulation layer comprises a dense insulation layer.

4. The semiconductor device according to claim 3, wherein the dense insulation layer comprises an HDP (high density plasma) layer.

5. The semiconductor device according to claim 1, wherein the second insulation layer comprises a flowable insulation layer.

6. The semiconductor device according to claim 5, wherein the flowable insulation layer comprises an SOD (spin-on dielectric) layer.

7. The semiconductor device according to claim 1, further comprising gates partially buried in the first insulation layer within the second trench, such that the gates are separately aligned on opposing sides of the second insulation layer within in the second trench.

* * * * *